United States Patent
Mäkivirta et al.

(10) Patent No.: US 10,135,414 B2
(45) Date of Patent: Nov. 20, 2018

(54) METHOD AND DEVICE FOR STORING EQUALIZATION SETTINGS IN ACTIVE LOUDSPEAKER

(71) Applicant: Genelec Oy, Iisalmi (FI)

(72) Inventors: Aki Mäkivirta, Iisalmi (FI); Kari Pöyhönen, Iisalmi (FI); Ilpo Martikainen, Iisalmi (FI)

(73) Assignee: Genelec Oy, Iisalmi (FI)

( * ) Notice: Subject to any disclaimer, the term of this patent is extended or adjusted under 35 U.S.C. 154(b) by 187 days.

(21) Appl. No.: 14/534,194

(22) Filed: Nov. 6, 2014

(65) Prior Publication Data

US 2015/0125000 A1    May 7, 2015

(30) Foreign Application Priority Data

Nov. 6, 2013  (FI) ...................... 20136088
Nov. 4, 2014  (WO) .................. PCT/FI2014/050830

(51) Int. Cl.
*H03G 5/16* (2006.01)
*H03G 5/00* (2006.01)

(52) U.S. Cl.
CPC ............. *H03G 5/165* (2013.01); *H03G 5/005* (2013.01)

(58) Field of Classification Search
CPC ............................... H03G 5/005; H03G 5/165
USPC ........................................................ 381/103
See application file for complete search history.

(56) References Cited

U.S. PATENT DOCUMENTS

| | | | |
|---|---|---|---|
| 4,631,749 A | 12/1986 | Rapaich | |
| 6,385,322 B1 | 5/2002 | Mietling | |
| 6,859,538 B1 | 2/2005 | Voltz | |
| 6,999,826 B1 | 2/2006 | Zhou et al. | |
| 7,653,344 B1 | 1/2010 | Feldman et al. | |
| 2002/0165466 A1* | 11/2002 | Givens | A61B 5/121 600/559 |
| 2009/0147134 A1 | 6/2009 | Iwamatsu | |
| 2009/0225996 A1* | 9/2009 | Brooking | H04R 3/04 381/59 |
| 2010/0272270 A1* | 10/2010 | Chaikin | H04R 29/008 381/59 |
| 2012/0213382 A1 | 8/2012 | Tracy | |
| 2014/0112484 A1* | 4/2014 | Britt, Jr. | H04R 29/001 381/59 |

FOREIGN PATENT DOCUMENTS

| | | |
|---|---|---|
| JP | H09284424 A | 10/1997 |
| JP | 2009130643 A | 6/2009 |
| JP | 2010288119 A | 12/2010 |
| WO | WO2009155057 A1 | 12/2009 |
| WO | WO2012111043 A1 | 8/2012 |
| WO | WO2013124490 A2 | 8/2013 |

\* cited by examiner

*Primary Examiner* — Paul S Kim
(74) *Attorney, Agent, or Firm* — Seppo Laine Oy

(57) ABSTRACT

The invention relates to a method and a loudspeaker for storing equalization settings in an active loudspeaker including a loudspeaker cabinet, at least one driver connected to the cabinet and an amplifier electronics including an equalizer, in which method the loudspeaker is calibrated in controlled conditions for forming factory calibration parameters for controlling the equalizer, the factory calibration parameters controlling the equalizer are stored in the amplifier electronics. In accordance with the invention the factory calibration parameters are also stored in a memory fixedly mounted to the loudspeaker.

21 Claims, 1 Drawing Sheet

METHOD AND DEVICE FOR STORING EQUALIZATION SETTINGS IN ACTIVE LOUDSPEAKER

Figure 1:
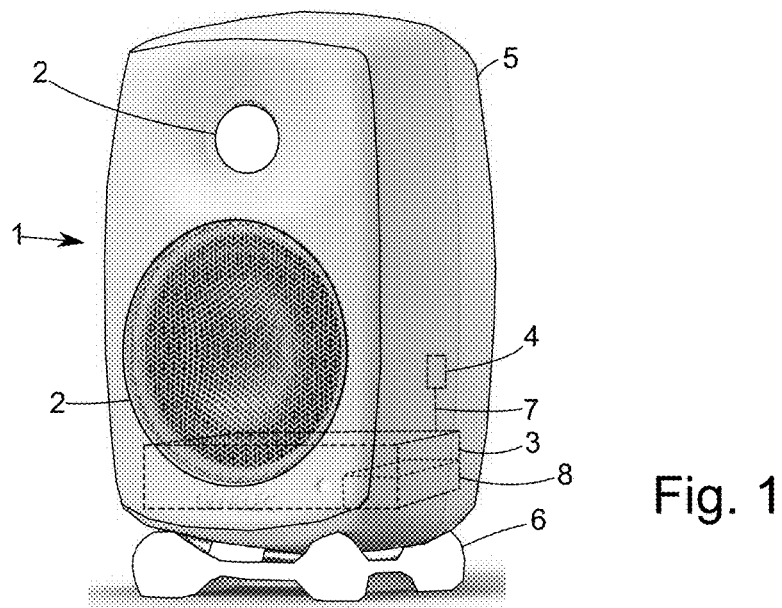

The present invention relates to a method according to the preamble of Claim 1.

The invention also relates to a device.

Generally the present invention concerns active loudspeakers, loudspeakers having built-in amplifiers or alternatively each driver of the active loudspeaker may have an individual audio channel with own filter and amplifier.

Especially the invention concerns method and device for storing and restoring equalization settings in an active loudspeaker.

In loudspeaker systems where the amplifier is not built in with the loudspeaker cabinet the amplifier is usually individually calibrated with the enclosure and its drivers. This makes the cabinet and the amplifier a pair that has been matched together. Therefore it is not possible to use the amplifier from another loudspeaker system of the same type with a given enclosure.

This leads into several practical problems in installing loudspeakers. These include:

The amplifier-loudspeaker pairs can easily be lost because the enclosures are usually installed early during the building process and the amplifiers may be stored away, and when finally installing the amplifiers, the amplifier-cabinet pairs may not be correctly matched and the system responses are not accurate.

If the wrong amplifier is used, the frequency response of the system is not properly calibrated and there is a response error.

In the event of an amplifier repair, the replacement or repaired amplifier will have to be individually calibrated with the enclosure, making amplifier repair complex, time consuming, and difficult.

For the above reasons, it would be beneficial to provide a method and a loudspeaker solving at least some of the above problems.

In a first aspect, the invention is based on using an additional memory for storing the factory calibration parameters in a backup memory and positioning the memory in the loudspeaker enclosure.

One embodiment of the invention the memory contains information of the calibration parameters for all of the drivers.

According to other aspects and embodiments of the present invention, there are several memories, one for each driver.

According to one further aspect of the invention the memory has a capability transfer the stored information wirelessly to the amplifier electronics.

More specifically, the method according to the invention is characterized by what is stated in the characterizing portion of Claim 1.

The apparatus according to the invention is, in turn, characterized by what is stated in the characterizing portion of Claim 10.

This invention provides several advantages:

The present invention removes the need to individually calibrate the amplifier with a certain cabinet.

Any amplifier of the same type can be used with any enclosure because the correct individual settings are set by reading the settings in the enclosure.

Exactly the same amplifier can be manufactured and used with different enclosures There are savings in manufacturing and spare parts service because the amplifier is no longer individually matched to the enclosure.

In an installation, there will be no errors because the amplifiers are not properly matched to the enclosures, and the installation work becomes faster, easier, and error free.

Reading and using the correct calibration settings is automatic and this eliminates human error in (re) calibration Other objects and features of the invention will become apparent from the following detailed description considered in conjunction with the accompanying drawings. It is to be understood, however, that the drawings are intended solely for purposes of illustration and not as a definition of the limits of the invention, for which reference should be made to the appended claims.

The following reference numbers will be used in connection with the terms describing the invention:

1 loudspeaker or active loudspeaker
2 driver
3 amplifier electronics
4 memory chip, memory, tag
5 loudspeaker cabinet, enclosure
6 loudspeaker support (optional)
7 loudspeaker calibration cable
8 equalizer
10 power supply system
11 signal processing platform
12 power amplifier platform
13 driver amplifiers
14 electro acoustical system FIG. 1 shows a loudspeaker according to the invention.

Figure 2:
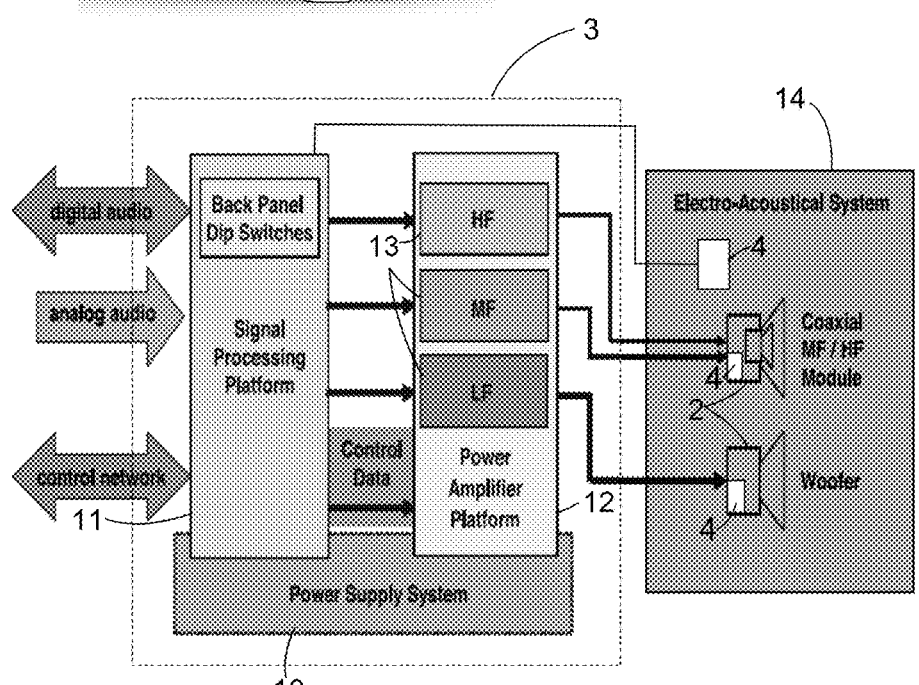

FIG. 2 shows a block diagram of the loudspeaker of FIG. 1.

The modern amplifiers of active loudspeakers have flexibility because they use digital signal processing. This means that the cabinet calibration can be adjusted by setting the correct filter coefficient values into the memory of the amplifier unit with DSP (Digital Signal Processing) capability.

In FIG. 1 is presented a typical implementation in connection with an active loudspeaker 1 comprising a cabinet 5, drivers 2, amplifier electronics 3 and necessary inputs (not shown) for power and signal.

According to this invention a memory chip 4 is built into, or fixedly connected to the loudspeaker cabinet 5 and this memory chip 4 in the cabinet contains the individual and unique cabinet-related factory correction settings for the equalizing filters needed in order to produce a properly equalized loudspeaker system.

A typically serial communication link is established inside the cabinet 5 between the chip 4 and the amplifier electronics 3 over the loudspeaker cable 7 connecting the amplifier electronics 3 to the chip 4. The loudspeaker cable 7 also provides the DC voltage (power) for the memory chip 4 inside the cabinet 5.

The amplifier electronics 3 reads the memory chip 4 inside the loudspeaker cabinet 5 and sets the coefficient values in the signal processing system inside the amplifier 3 according to the data stored in the memory chip 4.

Whenever a new cabinet 5 is connected to the amplifier electronics 3, this mechanism ensures that the correct individual cabinet-related equalization settings are always used.

The coefficients are stored in the memory chip 4 during the production time. The memory chip 4 is physically inside the loudspeaker cabinet 5. In order to prevent tampering and copying the coefficients can be secured, and the communication across the loudspeaker calibration cable 7 can also be secured and encrypted, making this a system that only authorized products can be used.

In accordance with FIG. 2 the amplifier electronics 3 typically comprises a power supply system 10, signal processing platform 11 including equalizer functions and a power amplifier platform 12 including amplifiers 13 for each driver 2. In accordance with the invention a memory chip 4 is located in an electro-acoustical system 14, which comprises the drivers 2 and the loudspeaker cabinet 5. The memory chip 4 includes the parameters of the factory calibration for controlling the signal processing platform 11.

The memory chip 4 and other electronics needed to implement the present invention are low cost and readily available on the market. Two additional conductors 7 in the loudspeaker 1 are enough for the communication between the chip 4 and the amplifier electronics 3, and these do not need a large cross-sectional area because the current and voltage levels needed in this application are small.

The memory chip 4 may be also a wireless RFID of NFC-tag and in this case the amplifier 3 must have a suitable wireless reading electronics and antennas for the tag. Also other wireless technologies may be used.

Additional applications of the technology in the invention are listed in the following.

A serial data communication interface can also make the amplifier to loudspeaker cabinet cable harness more simple, and this can produce cost savings because also other functions physically placed on the cabinet can be accessed over the serial communication link.

Once there is a data link across the loudspeaker cable 7 this link can also be used for other applications. One example includes the LED lights that are typically installed in a loudspeaker cabinet for customer feedback. These include system power on/off LED, clip indicator LED, and system overload LED.

The serial data interface can additionally be used to carry the data needed to turn these LED lights on and off.

At the moment the drive to the LED lights requires at least one separate conductor on the loudspeaker cabinet to amplifier interconnecting cable, and one common conductor. Using the invention several conductors can be removed in the loudspeaker cabinet-amplifier interconnecting cable. This lowers the cost of the interconnecting cable and in this way also the system cost.

In practice the loudspeaker 1 is factory calibrated in controlled conditions, e.g. in an anechoic chamber in order to compensate for the individual differences between the drivers 2. The parameters relating to this factory calibration are stored both in the signal processing platform 11 of the loudspeaker 1 and in the memory chip 4 located in the loudspeaker cabinet 5. The chip may include parameters of all drivers 2 of the loudspeaker 1 or each driver 2 may have memory chips 4 of their own.

Typically, the user of the loudspeaker makes a further calibration at the listening site in order to compensate for the flaws of the listening space. In accordance with the invention the parameters for this listening space calibration can be separated from the parameters for the factory calibration.

In other words the typical target for frequency specific loudspeaker calibration is to provide a flat frequency response across the system passband. Loudspeaker calibration data includes information on the sensitivities of the drivers as a function of frequency and the frequency-specific adjustment of the sound output level to render specified frequency response.

It is possible, in principle, to achieve multiway loudspeaker calibration using a single calibration data memory containing the full calibration data needed to render the specified loudspeaker frequency response. This is the first embodiment of the invention, where this calibration data memory is attached to the enclosure 5 (cabinet).

In the second embodiment of the invention, the total calibration is divided into a part that describes the enclosure-specific calibration and the parts that describe the driver-specific calibrations for each driver. When this second embodiment is used, the calibration data is stored into multiple memory chips 4, one chip for each driver in a multiway loudspeaker 1. When each driver 2 carries a memory for driver-specific calibration, the enclosure-specific calibration data may also be needed. The enclosure-specific calibration data may be stored in a memory that is attached to the enclosure 5 (cabinet). The amplifier 3 reads the enclosure-specific and driver-specific data, and combines them to form the total calibration for a multiway loudspeaker 1. Combining the data implies combining the frequency-specific sensitivity information related to each driver 2 with the frequency-specific sensitivity information related to the enclosure. When the driver and enclosure-specific data are combined, this creates a total system calibration that renders a flat frequency response.

The second embodiment gives several benefits. When one driver 2 is replaced in a multiway loudspeaker system, and the driver-specific calibration is automatically read from the memory 4 attached to the driver 2, the drivers 2 becomes automatically calibrated properly at the system start-up, and no manual recalibration is needed after replacing any single driver. When the driver-specific calibration data and enclosure-specific calibration data are separated, into separate memories 4, the drivers 2 become modular building blocks and can be used in multiple different types of enclosures 5 (cabinets) without any change to the driver-specific calibration data. This can result in improved reliability for service work and improved accuracy and repeatability of the designed loudspeaker frequency response. The drivers can be manufactured and calibrated to high accuracy without the knowledge of the specific enclosure where they will be used.

In one embodiment of the invention the memory 4 is a loudspeaker or driver specific tag like 2D barcode or 1D barcode tag or RFID tag including either the same information as an electronic memory 4 or a link to a source where this information can be downloaded.

In this application mounting the memory fixedly means e.g. mounting the memory 4 (like semiconductor memory, RFID tag or 2D or 1D barcode) to the loudspeaker by glue, elastic glue, nails or screws, magnet, velcro or their combination such that the memory 4 stays in permanent contact directly or indirectly via the mounting means (glue, elastic glue, nails or screws, magnet, velcro or their combination) with either loudspeaker 1 or its enclosure or driver or equivalents thereof.

In one embodiment of the invention the loudspeaker may have two or more memories 4, first for the enclosure and the second for at least one driver. This combination may be needed if e.g. the enclosure 5 is damaged and has to be replaced by an updated version of the enclosure while the amplifier and drivers may be reused as such.

The invention claimed is:
1. A method for storing equalization settings in an active loudspeaker including a loudspeaker cabinet, at least one driver connected to the cabinet and an amplifier electronics including an equalizer, in which method the loudspeaker is calibrated in controlled conditions for forming factory calibration parameters for controlling the equalizer, the factory calibration parameters comprising at least one of:
  filter coefficient values,
  factory correction settings for equalizing filters, and the factory calibration parameters controlling the equalizer are stored in the amplifier electronics, wherein the factory calibration parameters are also stored in a memory fixedly mounted to the loudspeaker.

2. The method in accordance with claim 1, wherein the memory is fixedly mounted to the loudspeaker cabinet.

3. The method in accordance with claim 1, wherein the memory is fixedly mounted to at least one driver.

4. The method in accordance with claim 1, wherein the loudspeaker includes a first memory including at least information about the loudspeaker cabinet and at least one second memory including at least information about a driver.

5. The method in accordance with claim 1, wherein the memory is connected with the amplifier electronics with a serial cable.

6. The method in accordance with claim 1, wherein the memory is connected with the amplifier electronics wirelessly.

7. The method in accordance with claim 1, wherein the memory interface is used for controlling other functions of the loudspeaker electronics.

8. The method in accordance with claim 1, wherein the memory is a tag like 2d barcode or RFID-tag including the factory calibration parameters.

9. The method in accordance with claim 1, wherein the memory is a tag like 2d barcode or RFID-tag including a link to factory parameters.

10. A loudspeaker comprising;
  a loudspeaker cabinet,
  at least one driver connected to the cabinet,
  amplifier electronics including an equalizer with a memory for storing equalization parameters, the equalization parameters comprising at least one of:
    filter coefficient values
    factory correction settings for equalizing filters, and
  an additional memory fixedly mounted to the cabinet and having telecommunications capabilities with the amplifier electronics for storing and reloading backup values of the factory calibration.

11. The loudspeaker in accordance with claim 10, wherein the memory is fixedly mounted to the loudspeaker cabinet.

12. The loudspeaker in accordance with claim 10, wherein the memory is fixedly mounted to at least one driver.

13. The loudspeaker in accordance with claim 10, wherein the loudspeaker includes a first memory including at least information about the loudspeaker cabinet and at least one second memory including at least information about a driver.

14. The loudspeaker in accordance with claim 10, wherein the memory is connected with the amplifier electronics with a serial cable.

15. The loudspeaker in accordance with claim 10, wherein the memory is connected with the amplifier electronics wirelessly.

16. The loudspeaker in accordance with claim 10, wherein memory interface is used for controlling other functions of the loudspeaker electronics.

17. The loudspeaker in accordance with claim 10, wherein the memory is a 2D tag, 1D barcode or RFID-tag including the factory calibration parameters.

18. The loudspeaker in accordance with claim 10, wherein the memory is a 2D tag, 1D barcode or RFID-tag which includes a link to the factory calibration parameters.

19. A method for storing equalization settings in an active loudspeaker including a loudspeaker cabinet, at least one driver connected to the cabinet and an amplifier electronics including an equalizer, in which method
  the loudspeaker is calibrated in controlled conditions for forming factory calibration parameters for controlling the equalizer, and
  the factory calibration parameters controlling the equalizer are stored in the amplifier electronics,
wherein
  the factory calibration parameters and enclosure-specific calibration data are also stored in a memory fixedly mounted to the loudspeaker.

20. The method in accordance with claim 19, wherein the loudspeaker includes at least one second memory including at least information about a driver.

21. The method in accordance with claim 19, wherein the memory is at least one of a 2D barcode or RFID tag.

* * * * *